United States Patent [19]

Tsunoda

[11] Patent Number: 5,023,684
[45] Date of Patent: Jun. 11, 1991

[54] COMPOSITE SEMICONDUCTOR DEVICE HAVING FUNCTION FOR OVERCURRENT DETECTION

[75] Inventor: Tetsujiro Tsunoda, Fujisawa, Japan

[73] Assignee: Kabushiki Kaisha Toshiba, Kawasaki, Japan

[21] Appl. No.: 575,614

[22] Filed: Aug. 31, 1990

[30] Foreign Application Priority Data

Sep. 1, 1989 [JP] Japan ................................. 1-227245

[51] Int. Cl.$^5$ ................ H01L 27/22; H02H 3/00; H02H 3/18; H03K 17/90
[52] U.S. Cl. ...................................... 357/27; 361/93; 361/87; 307/309; 324/252
[58] Field of Search .................. 357/27; 361/93, 87; 307/309; 324/252, 251

[56] References Cited

U.S. PATENT DOCUMENTS

| 4,829,352 | 5/1989 | Popovic et al. | 357/27 |
| 4,939,448 | 7/1990 | Gudel | 324/251 |
| 4,945,445 | 7/1990 | Schmerda et al. | 361/87 |

FOREIGN PATENT DOCUMENTS 61-186873  8/1986  Japan ................................. 324/252

OTHER PUBLICATIONS

Hollis, J. E., "Micro-Electronic Magnetic Transducers", Measurement and Control, vol. 6, Jan. 1973, pp. 38–40.

Primary Examiner—Rolf Hille
Assistant Examiner—Robert P. Limanek
Attorney, Agent, or Firm—Finnegan, Henderson, Farabow, Garrett and Dunner

[57] ABSTRACT

An insulating substrate has a U-shaped conductive layer which produces a magnetic field when a current flows therethrough as indicated by arrows. The substrate also includes a conductive layer on which a power semiconductor element is mounted through its main electrode. A current detector such as Hall effect elements is located inside the U-shaped conductive layer. When a load current flows through the semiconductor element, it flows through the conductive layer to produce the magnetic field since the other main electrode of the semiconductor element is electrically connected to one end of the conductive member through a metal wire. Accordingly, the load current flowing through the semiconductor element will be effectively detected by the current detector without connecting a resistor or current transformer to external terminals of a power semiconductor device, thereby providing a composite semiconductor device with a compact structure used for inverters for driving three-phase motors, etc.

16 Claims, 4 Drawing Sheets

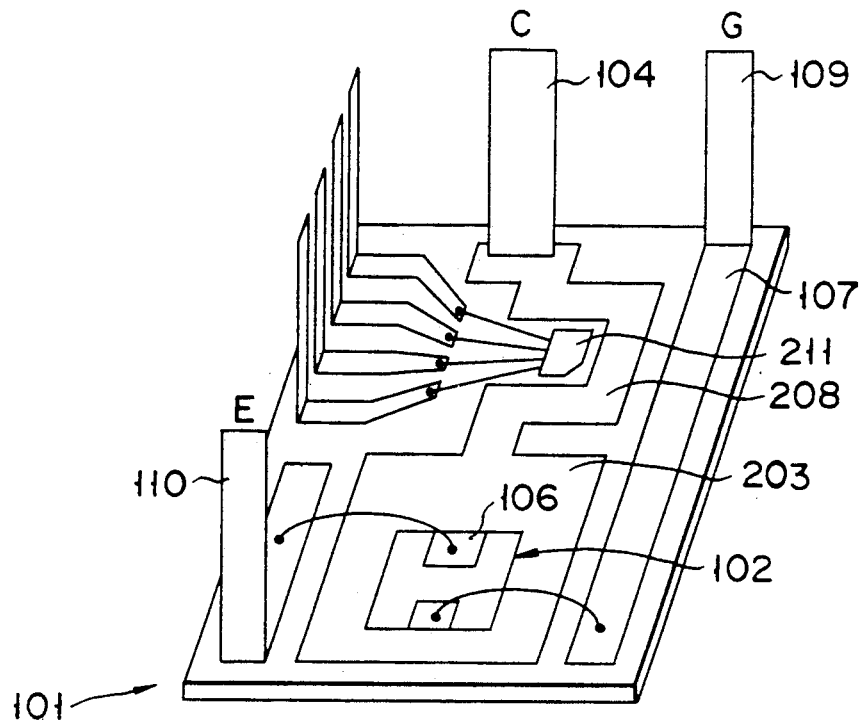
F I G. 2
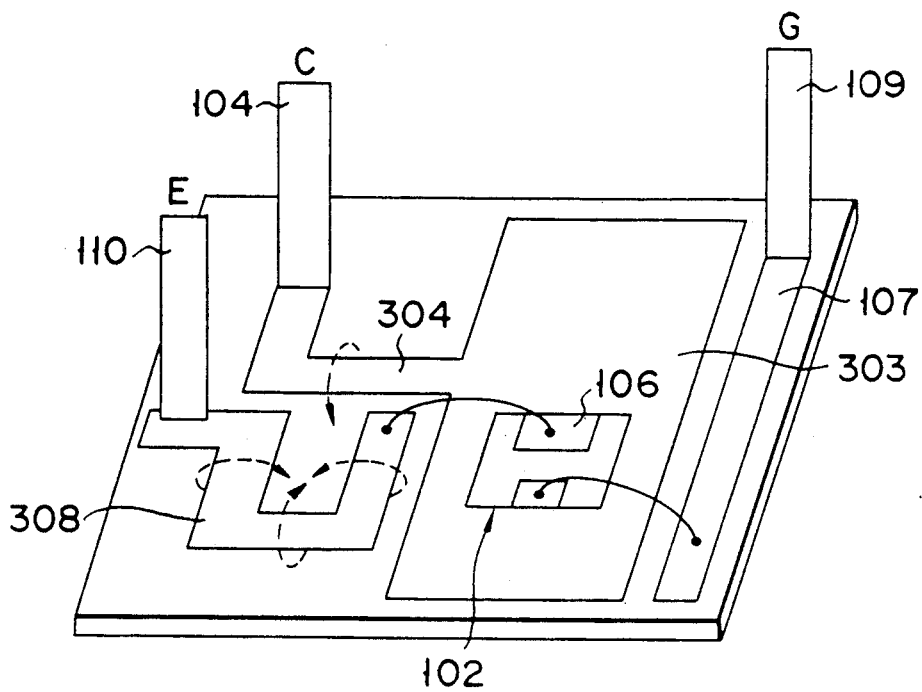
F I G. 3

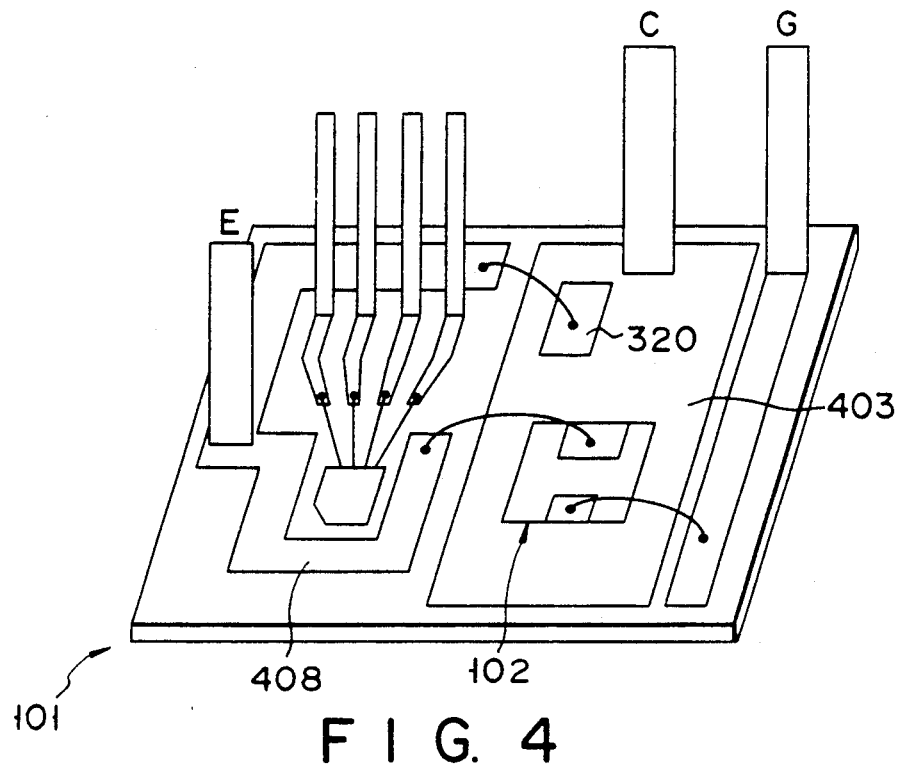
F I G. 4

COMPOSITE SEMICONDUCTOR DEVICE HAVING FUNCTION FOR OVERCURRENT DETECTION

BACKGROUND OF THE INVENTION

1. Field of the Invention

The present invention relates to a semiconductor device including semiconductor elements such as diodes, transistors, and thyristors, and more particularly, to a composite semiconductor device having a function for overcurrent detection.

2. Description of the Related Art

As a high power semiconductor device in a composite semiconductor device having a function for overcurrent detection, an IGBT (Insulated Gate Bipolar Transistor) has been used. FIG. 5A is a perspective view (resin-sealed portion is omitted) showing an internal structure of the IGBT, FIG. 5B is a view showing an appearance of the IGBT, and FIG. 5C is a view showing an equivalent circuit, respectively. As shown in FIG. 5A, in the IGBT, an insulating substrate 1 is used, which includes conductive layers 2, 3, and 4 such as copper foils provided on a ceramic substrate. A semiconductor element chip (IGBT) 5 has a collector electrode (main electrode) on one major surface (lower surface) and an emitter electrode (main electrode) 6 and a gate electrode 7 on the other major surface (upper surface). The collector electrode of the semiconductor element 5 is mounted on the conductive layer 2 by soldering or the like, and the conductive layers 3 and 4 are electrically connected to the gate electrode 7 and the emitter electrode 6 through a metal wire or the like, respectively. The conductive layers 2, 3, and 4 are connected to external terminals 8, 9, and 10 of a collector (C), a gate (G), and an emitter (E), respectively. The semiconductor element described above is finally resin-molded and has an appearance shown in FIG. 5B.

In the case of the high power semiconductor device, for preventing the semiconductor device from unwanted breakdown caused by an overcurrent, a resistor 11 for detecting a current is connected in series with the main current path as shown in FIG. 6A, or a current transformer 12 is connected to the main current line as shown in FIG. 6B, thereby performing a current detection. Information for the overcurrent passage is then obtained from the current detection. The information is fed from T1 and T2 terminals or T3 and T4 terminals, and is fed back to a drive circuit of the semiconductor device to reduce the overcurrent.

However in the current detection using the resistor shown in FIG. 6A, a power loss occurs due to the product of the voltage developed across the resistor and the current flowing therethrough even in a steady energization state. Since the power loss is increased in accordance with an increase in steady current value, power efficiency is decreased in a semiconductor device using a high current. In addition, since a high allowable loss is required, the size of the resistor becomes large. Therefore, the current detection using the resistor is not generally employed in devices utilizing the high current.

Further, in the current detection using the current transformer shown in FIG. 6B, since the power loss does not occur unlike the method using the above resistor, a high current can be detected. However, in this method, a theoretically perfect DC current ($di/dt = 0$) cannot be detected. Further, when a pulse current flows through the current transformer to detect the high current with a relatively long pulse width, a current transformer having a relatively large size must be used.

As described above, it is difficult to incorporate the current detector, such as current transformers, resistors, etc., in the semiconductor device. When the high power semiconductor device is practically used, a current transformer must be added to the high power semiconductor device in the case where the current is high, and a resistor must be also added to the high power semiconductor device in the case of a comparatively low current. At any rate, the handling of the resistor or current transformer is very complicated. The function for current detection has the above-described inconvenience.

A generally used composite semiconductor device having a function for overcurrent detection is shown in FIG. 7A.

The same reference numerals in FIG. 7A denote the same or corresponding parts as in FIGS. 5A to 5C. A semiconductor element 25 shown in FIG. 7A has a current detection electrode 26 which is connected to an external terminal 28 for current detection (Es) through both a metal wire and a conductive layer 27. In the composite semiconductor device, a current can be easily detected from the current detection external terminal. FIG. 7B shows an equivalent circuit of the composite semiconductor device.

In the semiconductor device described above, the detected output appears between the current detection external terminal 28 (or Es) and an emitter external terminal 10 (or E). Therefore, when a plurality of semiconductor elements connected in series with one another are used (usual inverters for three-phase motor drive or the like), electric potentials of ground terminals (emitter E) for current detection outputs in semiconductor elements are different from one another, so that the design of the feedback circuit is undesirably complicated. When the semiconductor device having the function for current detection described above is used, a semiconductor element must be newly designed and developed. In addition, in the developed semiconductor element, the area of the active region is decreased due to the electrode area provided for the current detection output. When equal rated current values are to be obtained, the chip size of the semiconductor element becomes large to increase the chip cost.

As described above, it is important to prevent the semiconductor device, particularly, the high power semiconductor device, from the breakdown caused by the overcurrent. For this reason, various overcurrent detecting means have been proposed. When the current detection resistor or the current transformer is connected in series with the main current path of the semiconductor element, it must be externally added to the semiconductor element since these parts are relatively large in size. The power loss occurs in the resistor, and the current transformer is not suitable for DC current detection. Therefore, these means are functionally inconvenient. In the semiconductor device having the function for current detection, the above problem can be improved. However, when a plurality of semiconductor elements are used in serial and parallel connections as employed in inverters for driving three-phase motors, common potential terminals cannot be often provided among detected signal output terminal pairs of respective elements, and the design of the feedback circuit is complicated. In addition, when a function for current detection is added to the semiconductor element, the chip size is undesirably increased.

SUMMARY OF THE INVENTION

It is, therefore, an object of the present invention to provide a composite semiconductor device which includes a current detection means having low power loss and excellent detection characteristics.

It is another object of the present invention to provide a composite semiconductor device which includes a current detection means electrically insulated from electrode terminals of a semiconductor element.

According to an aspect of the present invention, a semiconductor element through which a main current (load current) flows and a magnetoelectric transducer for detecting a magnetic field produced by the main current are integrally provided on an insulating substrate having a conductive layer for effectively producing the magnetic field.

In this case, the main electrode of the semiconductor element is an electrode through which a controlled load current flows. For example, in a diode or a general thyristor, anode and cathode electrodes are main electrodes. In a bipolar transistor or an IGBT, collector and emitter electrodes are main electrodes, and drain and source electrodes are main electrodes in a MOSFET or the like.

A conductive layer for connecting the main electrode of the semiconductor element to the main current external terminal constitutes a current path for a main current. With the main current flowing through the conductive layer, a magnetic field proportional to the magnitude of the main current is produced around the conductive layer. The magnetic field is detected using a magnetoelectric transducer, such as Hall effect elements, magnetoresistance elements, etc., which converts a magnetic signal to an electrical signal. That is, the magnetic field strength proportional to the magnitude of the main current is converted into the electrical signal by the magnetoelectric transducer, and this electrical signal appears across a pair of signal output terminals of the transducer.

According to a preferable aspect of the present invention, the conductive layer has a U-shaped portion which centers the magnetic flux corresponding to the main current, and the magnetoelectric transducer is located at the center of the U-shaped conductive layer.

When the drive circuit for the semiconductor element is not included in the semiconductor device, external terminals for feeding the electrical signal of the magnetoelectric transducer must be arranged in the semiconductor device.

The electrical signal fed from the magnetoelectric transducer is fed back to the drive circuit of the semiconductor device. When the main current reaches a predetermined current value which does not break down the semiconductor element just before the main current reaches the overcurrent value which may break down it, the detected electrical signal from the magnetoelectric transducer is fed back to the drive circuit, thereby suppressing an increase in the main current or breaking the main current. Therefore, unwanted breakdown of the semiconductor device can be prevented.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 2 is a perspective view showing a composite semiconductor device according to a second embodiment of the present invention;

FIG. 3 is a perspective view showing a relation between a current and a magnetic field of the composite semiconductor device according to a third embodiment of the present invention;

FIG. 4 is a perspective view showing a composite semiconductor device according to a fourth embodiment of the present invention;

DETAILED DESCRIPTION OF THE PREFERRED EMBODIMENTS

A composite semiconductor device according to the first embodiment of the present invention will be described below with reference to FIG. 1A.

Figure 1A:
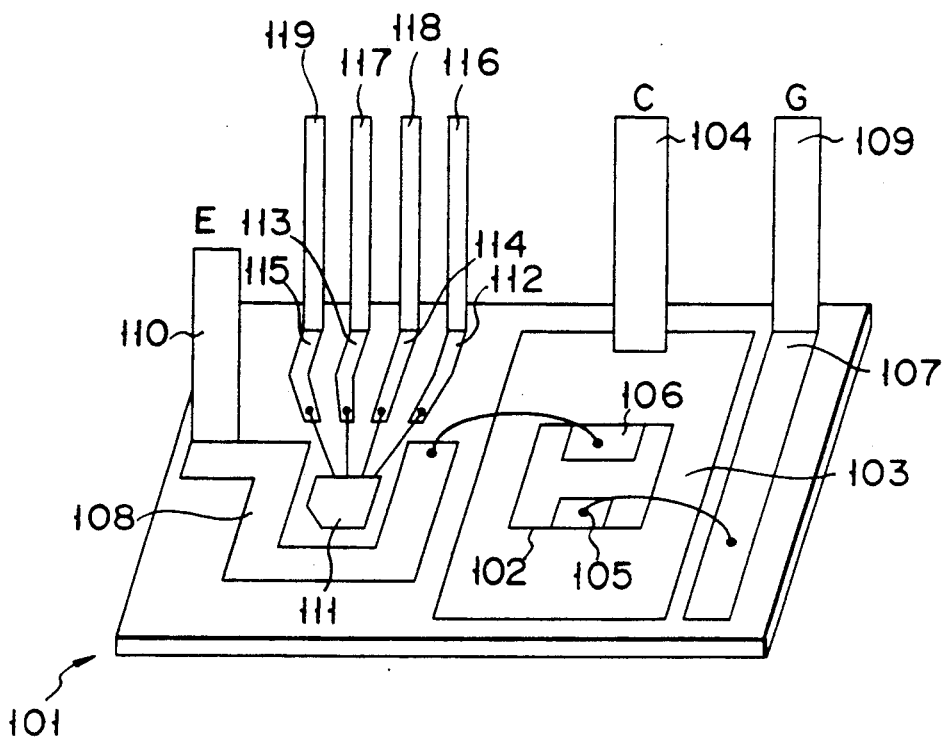
FIG. 1A is a perspective view showing a composite semiconductor device according to a first embodiment of the present invention.

Referring to FIG. 1A, as a semiconductor element through which a main current flows, a chip-like IGBT 102 is used. The IGBT 102 is mounted on an insulating substrate 101 which includes a conductive layer 103 provided on a ceramic substrate made of, e.g., alumina or aluminum nitride. The lower surface of the IGBT is a collector electrode and soldered on the conductive layer 103. A collector external terminal 104 is soldered on the conductive layer 103. A gate electrode 105 and an emitter electrode 106 serving as a main electrode are provided on the upper surface of the semiconductor element 102, and a metal wire is bonded on these electrodes by ultrasonic bonding or the like and connected to conductive layers 107 and 108, respectively. A gate external terminal 109 and an emitter external terminal 110 are soldered on the conductive layers 107 and 108, respectively. The conductive layer 108 is patterned so as to provide a U-shaped configuration as shown in FIG. 1A, and a Hall sensor 111 of a magnetoelectric transducer is fixed on an insulator of the substrate 101 located inside the U shaped portion. The Hall sensor 111 comprises a pair of control current input leads and a pair of Hall voltage output leads. The pair of control current input leads are connected to conductive layers 112 and 113, and control current input external terminals 116 and 117 are soldered on the conductive layers 112 and 113, respectively. The pair of Hall voltage output leads are connected to conductive layers 114 and 115, and Hall voltage output external terminals, i.e., current detection signal output external terminals 118 and 119 are soldered on the conductive layers 114 and 115. Finally, the substrate is resin-molded except a part of each external terminal to obtain a composite semiconductor device. In the above embodiment, as the conductive layer for connecting the main electrode of the semiconductor element to the main current external terminal, the metal wire and the conductive layer 108 are used in the emitter, and the conductive layer 103 is used in the collector.

Figure 1B:
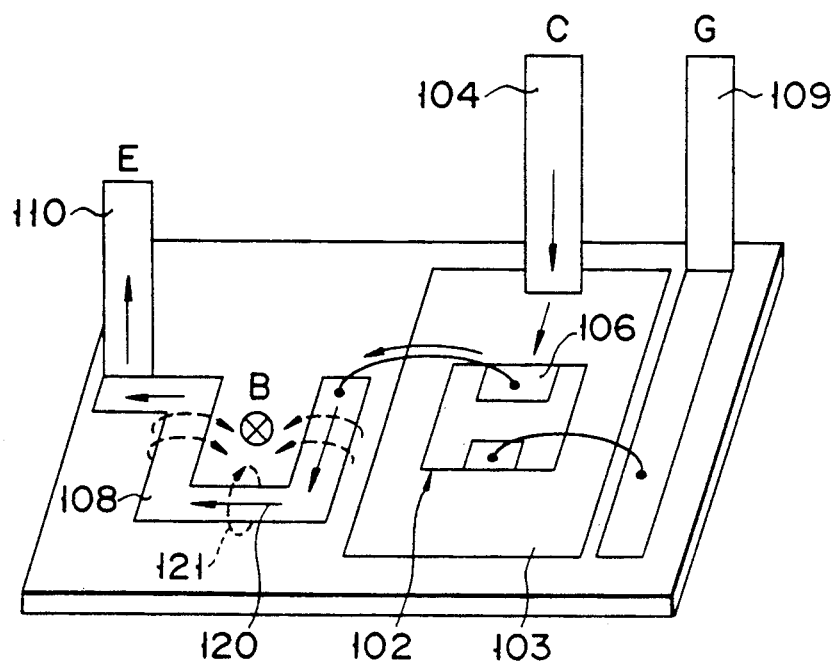
FIG. 1B is a perspective view showing a relation between a current and a magnetic field of the composite semiconductor device in FIG. 1A.
Figure 5A:
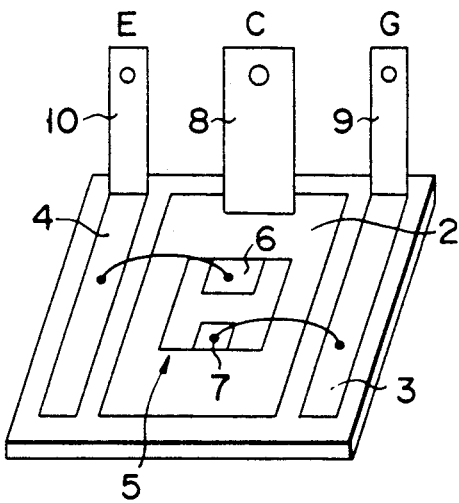
FIG. 5A is a perspective view showing an arrangement of a conventional semiconductor element through which a main current flows.
Figure 5B:
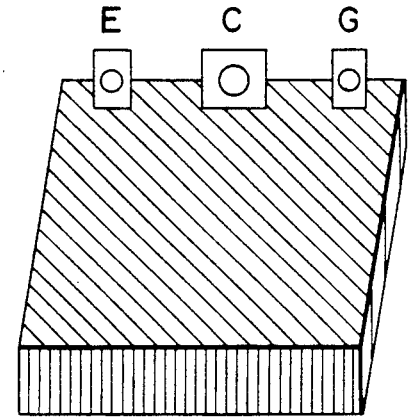
FIG. 5B is a perspective view showing an appearance of the semiconductor element in FIG. 5A.
Figure 5C:
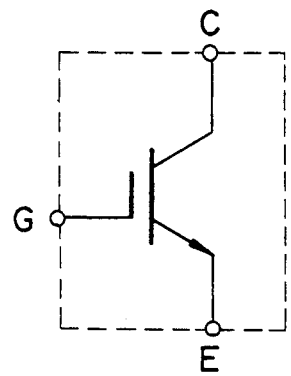
FIG. 5C shows an equivalent circuit of the semiconductor element in FIG. 5A.
Figure 6A:
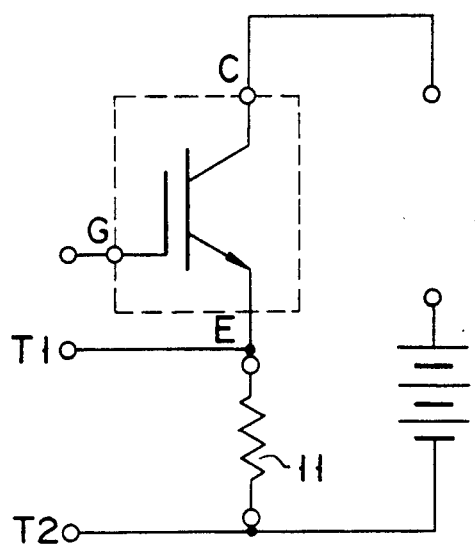
FIGS. 6A and 6B are circuits for explaining current detections in conventional composite semiconductor devices, respectively.
Figure 6B:
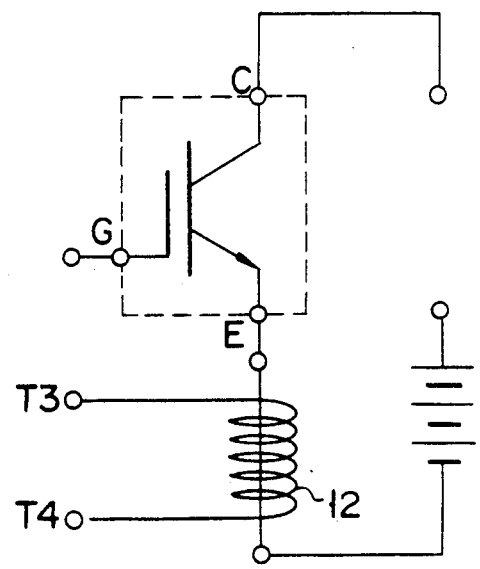
Figure 7A:
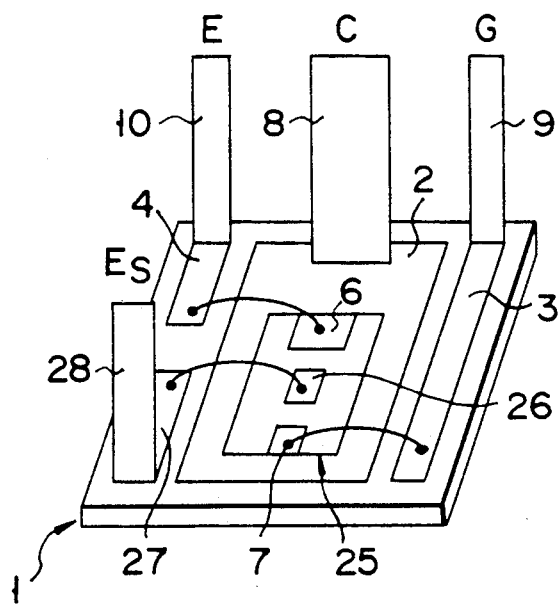
FIG. 7A is a perspective view showing an arrangement of a conventional composite semiconductor device having a function for current detection.
Figure 7B:
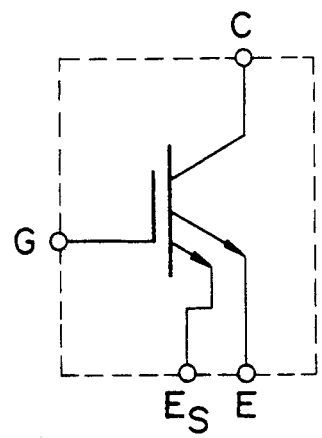
FIG. 7B is an equivalent circuit of the composite semiconductor device in FIG. 7A.

According to the above arrangement, as shown in FIG. 1B, when a current flows between the collector external terminal 104 and the emitter external terminal 110 in a direction of a solid-line arrow 120, a magnetic field indicated by a broken line 121 is produced around the conductive layer 108 according to the Ampere's corkscrew rule. Since the conductive layer 108 has the U-shaped configuration, a magnetic flux passing vertically through the substrate surface is concentrated inside the U-shaped portion. A mark in FIG. 1B shows that a magnetic flux B is directed from the upper surface to the lower surface of the drawing. The Hall sensor is arranged inside the U-shaped portion which has a high magnetic flux density, and a voltage proportional to the magnetic field, i.e., to the magnitude of the main current flowing between the collector and the emitter is provided between the Hall voltage output external terminals 118 and 119. Note that a control current with several mA is supplied between the control current input external terminals 116 and 117 of the Hall sensor.

As described above, since the current flowing through the semiconductor element is detected in the composite semiconductor device, a resistor, a current transformer, or the like specially provided for current detection need not be added to the semiconductor device. Therefore, the composite semiconductor device can be easily handled.

In addition, since the magnetic field, which is produced by the main current flowing through the conductive layer of the semiconductor element, is effectively employed to perform the current detection, the power loss due to the current detection does not almost occur. The current detection can be performed in an operation of the semiconductor element at all frequency bands including a DC current, and the current detection signal output terminals are electrically insulated from the electrodes of the semiconductor element. For this reason, the feedback circuit or the like can be easily designed.

In the above first embodiment, although the main current is detected from the magnetic field produced from the emitter conductive layer of the semiconductor element, the current may be detected from a conductive layer of the collector side in the same manner as described above according to the second embodiment, as shown in FIG. 2. Note that the same reference numerals in FIG. 2 denote the same or corresponding parts as in FIGS. 1A and 1B. The collector electrode of the lower surface of the semiconductor element 102 is fixed by soldering or the like on a conductive layer 203 which includes a U-shaped portion 208. A magnetoelectric transducer 211 is arranged inside the U-shaped portion.

The main current may be detected by a sum of magnetic fields produced from a conductive layer of the emitter side and from a conductive layer of the collector side. According to the third embodiment, as shown in FIG. 3, a magnetoelectric transducer is arranged inside a U-shaped portion surrounded by a part 304 of a conductive layer 303 of a collector side and a conductive layer 308 of an emitter side. For illustrative convenience, although the magnetoelectric transducer is not shown, it is desired to provide an interlevel insulator at an intersection between input/output leads of the transducer and a conductive layer.

In the above embodiment, although a part of the conductive layer is formed into the U-shaped portion, it may be circular and a swirl coil may be formed by the conductive layer. When a parasitic reactance which cannot be negligible is added to the main current path in accordance with an increase in the number of turns of the coil, switching characteristics may be lowered. Therefore, the increase in the number of turns must be carefully determined.

In the above embodiments, although the magnetic field produced by the conductive layer is used, a magnetic field produced from a part of the external terminal or the metal wire through which the main current flows may be employed. However, the Hall sensor must be properly located.

In the above embodiments, although the Hall sensor is used as the magnetoelectric transducer for current detection, a Hall IC with an amplifier may be used. In this case, a relatively low current can be detected with a high sensitivity. As the magnetoelectric transducer, a magnetoresistance element or the like may be used. In this case, although the linearity of the output signal of the magnetoelectric transducer is lowered with respect to the main current of the semiconductor element, no problem is caused as long as the main current and the output signal have a one-to-one correspondence.

In the above embodiments, although the IGBT is used as the semiconductor element, another high power semiconductor elements may be employed.

In the above embodiments, although one semiconductor element (except for the magnetoelectric transducer) is included in the composite semiconductor device, as shown in the fourth embodiment, a plurality of semiconductor elements such as free-wheeling diodes may be included in the composite semiconductor device. This embodiment is shown in FIG. 4. Referring to the drawing, reference numeral 408 denotes a conductive layer for producing a magnetic field, and reference numeral 320 denotes a free-wheeling diode. In this case, when an inductive load is connected, a magnetic field produced by a current flowing through the diode is not detected by the Hall sensor.

The semiconductor device according to the present invention will include so-called power modules which contain a plurality of power devices arranged in one package together with another electric parts, and will also involve resin-molded semiconductor structures which includes a power device using a lead frame as a substrate, and a magnetoelectric element.

In the above embodiments, although the chip-like element is used as the semiconductor element, the semiconductor element is not limited to it. For example, resin-molded semiconductor devices with exposed outer leads may be used.

As is described above, according to the composite semiconductor device of the present invention, the magnetic field produced by the current flowing through the conductive layer in the device is detected by the incorporated magnetoelectric transducer, and the overcurrent control can be performed by the detected signal output of the transducer. Therefore, according to the device of the present invention, externally adding parts for current detection such as resistors, current transformers, etc., will not be required, and the magnetic field produced by the main current can be effectively utilized. Therefore, the power loss due to the current detection will be extremely low, and detected characteristics will be excellent at all frequency bands including DC current. In addition, since detected signal output terminals are electrically insulated from electrode terminals of the semiconductor element, output terminals of the devices for current detection will be commonly grounded when a plurality of semiconductor devices are used to be connected in series with one another thereby facilitating the design of the feedback circuit.

It is further understood by those skilled in the art that the foregoing description is preferred embodiments of the disclosed device and that various changes and modifications may be made in the invention without departing from the spirit and scope thereof.

What is claimed is:

1. A composite semiconductor device having a function for overcurrent detection comprising:
   an insulating substrate including at least one first conductive layer for producing a magnetic field and at least one second conductive layer thereon;
   at least one semiconductor element having main electrodes, said semiconductor element being mounted on said second conductive layer through one of said main electrodes;
   external terminals electrically connected to one end of said first and second conductive layers; and
   a current detector for detecting said magnetic field produced by a main current flowing through said first conductive layer.

2. The composite semiconductor device according to claim 1, wherein said first and second conductive layers are electrically isolated from each other.

3. The composite semiconductor device according to claim 1, wherein said insulating substrate is composed of a ceramic substrate.

4. The composite semiconductor device according to claim 1, wherein said semiconductor element is selected from diodes, thyristors, power transistors, insulated gate bipolar transistors and MOS FETs.

5. The composite semiconductor device according to claim 1, wherein said first conductive layer has a U-shaped portion.

6. The composite semiconductor device according to claim 1, wherein said current detector is comprised of a magnetoelectric transducer such as Hall effect elements and magnetoresistance elements.

7. The composite semiconductor device according to claim 6, wherein said current detector is located inside said U-shaped portion of said first conductive layer.

8. The composite semiconductor device according to claim 2, wherein the other main electrode of said semiconductor element is electrically connected to the other end of said first conductive layer through a metal wire.

9. The composite semiconductor device according to claim 1, wherein said first conductive layer is integrally formed with said second conductive layer.

10. The composite semiconductor device according to claim 1, wherein said at least one first conductive layer includes a U-shaped conductive layer and another conductive layer integrally formed with said second conductive layer so as to produce said magnetic field in conjunction with said conductive layers.

11. The composite semiconductor device according to claim 4, wherein a gate electrode of said semiconductor element is electrically connected to another second conductive layer.

12. The composite semiconductor device according to claim 8, wherein leads of said current detector are electrically connected to external terminals through conductive layers provided on said insulating substrate.

13. The composite semiconductor device according to claim 1, wherein said device is molded with a resin material so as to expose a part of respective external terminals.

14. The composite semiconductor device according to claim 1, wherein a plurality of semiconductor elements are connected in parallel to one another.

15. The composite semiconductor device according to claim 1, wherein a plurality of semiconductor elements are connected in series to one another.

16. The composite semiconductor device according to claim 1, wherein a free-wheeling diode is mounted on said second conductive layer so as to be connected in parallel with said semiconductor element.

* * * * *